United States Patent [19]

Sauer

[11] Patent Number: 5,546,045
[45] Date of Patent: Aug. 13, 1996

US005546045A

[54] RAIL TO RAIL OPERATIONAL AMPLIFIER OUTPUT STAGE

[75] Inventor: Don R. Sauer, San Jose, Calif.

[73] Assignee: National Semiconductor Corp., Del.

[21] Appl. No.: 424,220

[22] Filed: Apr. 19, 1995

Related U.S. Application Data

[63] Continuation of Ser. No. 148,121, Nov. 5, 1993, abandoned.

[51] Int. Cl.⁶ .................................................. G06G 7/12
[52] U.S. Cl. ........................ 327/561; 327/78; 327/310; 327/313; 327/375; 327/379; 327/484; 327/491; 327/563
[58] Field of Search ...................................... 307/255, 254, 307/263, 270, 542, 546, 572, 354, 362, 456; 326/129; 327/77, 78, 108, 170, 310, 311, 312, 313, 375, 379, 380, 484, 485, 489, 491, 560, 561, 563

[56] References Cited

U.S. PATENT DOCUMENTS

| | | | |
|---|---|---|---|
| 3,947,776 | 3/1976 | Stevens et al. | 307/270 |
| 4,318,011 | 3/1982 | Zeis | 307/255 |
| 4,910,416 | 3/1990 | Salcone | 307/254 |
| 4,992,677 | 2/1991 | Ishibashi et al. | 307/542 |
| 5,043,602 | 8/1991 | Flannagan | 307/263 |
| 5,047,656 | 9/1991 | Witt, III | 307/270 |
| 5,099,138 | 3/1992 | Fukunaga | 307/254 |
| 5,140,591 | 8/1992 | Palara et al. | 307/270 |
| 5,142,245 | 8/1992 | Barbu | 307/254 |
| 5,184,029 | 2/1993 | King | 307/270 |

FOREIGN PATENT DOCUMENTS

| | | | |
|---|---|---|---|
| 63-187810 | 8/1988 | Japan | 307/270 |

OTHER PUBLICATIONS

Jeroen Fonderie, "Design of Low–Voltage Bipolar Operational Amplifiers", Nov. 18, 1991, pp. 144–187.
Motorola Semiconductor Technical Data Sheet, MC33201–including Figs. 1–25.
James A. Kuzdrall, "Drive SAR ADCs With Low–Z Buffer", *Electronic Design*, Oct. 12, 1989, pp. 75–78 and 80–81.

*Primary Examiner*—Terry Cunningham
*Attorney, Agent, or Firm*—Limbach & Limbach L.L.P.

[57] ABSTRACT

An integrated circuit output stage is intended for use with an operational amplifier. The output is capable of driving capacitive load to within a $V_{SAT}$ of the power supply rails. The complementary output transistors are driven by way of a combination of buffers and complementary differential amplifiers which act to bias the stage in class AB. The quiescent current is stabilized and controlled, in part, by simple resistor rationing. The output transistor saturation is sensed and a current limit is imposed so that hard saturation is avoided. Frequency compensation is achieved in a manner that responds to output transistor saturation so as to improve the high frequency transient response. Feedforward capacitors are also included to further improve high frequency response.

17 Claims, 2 Drawing Sheets

RAIL TO RAIL OPERATIONAL AMPLIFIER OUTPUT STAGE

This is a continuation of application Ser. No. 08/148,121 filed on Nov. 5, 1993, now abandoned.

BACKGROUND OF THE INVENTION

The invention relates to an integrated circuit (IC) operational amplifier (op-amp) output stage which is capable of driving an output terminal to within a small increment of the power supply rail potentials. This increment is a single transistor saturation voltage ($V_{SAT}$). The output stage circuit is designed to operate in class AB bias conditions and is intended to operate under stable conditions when driving a capacitive load. The circuit employs vertically constructed PNP and NPN IC transistors of the kind set forth in U.S. Pat. No. 4,940,671.

The circuit of the invention is intended for driving capacitive loads and to operate at low supply voltages. Rapid settling time, after transient drive, is desirable and output transistor hard saturation is to be avoided while providing relatively large output currents.

SUMMARY OF THE INVENTION

It is an object of the invention to provide an IC output stage having substantially rail-to-rail output drive capability for driving capacitive loads.

It is a further object of the invention to avoid hard saturation in a rail-to-rail IC output stage.

It is a still further object of the invention to provide rapid settling of a rail-to-rail IC output stage after the application of a drive transient.

These and other objects are achieved in a circuit configured as follows. A complementary pair of common emitter output transistors are coupled in series between the supply rails without any intervening components. Thus, when the transistors are driven to low level saturation, the output swing is substantially rail-to-rail. That is, the output will be within a $V_{SAT}$ of the rail potential. The output transistors are driven from complementary emitter follower buffer drivers so that the stage displays a large current gain as well as a voltage gain. Each of the output transistors has an overdrive sensing circuit which is coupled to the buffer driver input so that the onset of saturation is detected and the buffer driver gain reduced so as to avoid hard saturation. A pair of complementary diff-amps are coupled to drive the buffer drivers and these diff-amps have their inputs connected in parallel. The inverting inputs are biased at one-half of the supply voltages and the non-inverting inputs comprise the stage input node. A frequency compensation capacitor is coupled between the input node and the commonly-connected collectors of the output transistors. Thus, a relatively large Miller capacitance exists at this input node. The size of the compensation capacitor is chosen to be lower than the stray capacitance at the input node. As a result, the Miller capacitance effect allows the compensation capacitor to pass all of the signal input current at the higher frequencies. Since the compensation capacitor is small, the circuit gain bandwidth is large. However, for high capacitance circuit loads the compensation capacitor cannot pass all of the signal current and the gain drops off and the circuit stability is enhanced.

The voltage gain of the diff-amps is controlled to be below unity and feed-forward capacitors are coupled between each of the diff-amp outputs and the stage input terminal. This provides a 90° leading phase to the output drive transistors to enhance the circuit phase margin. The phase of the feed forward prevents the capacitors from loading the circuit input. Thus, the high frequency performance and transient response is ensured. The stage voltage gain is provided by the common emitter output transistors. The stage current gain, which is provided by the output transistors in cascade with the buffer drivers and the diff-amps, is very large.

DESCRIPTION OF THE INVENTION

Figure 1:
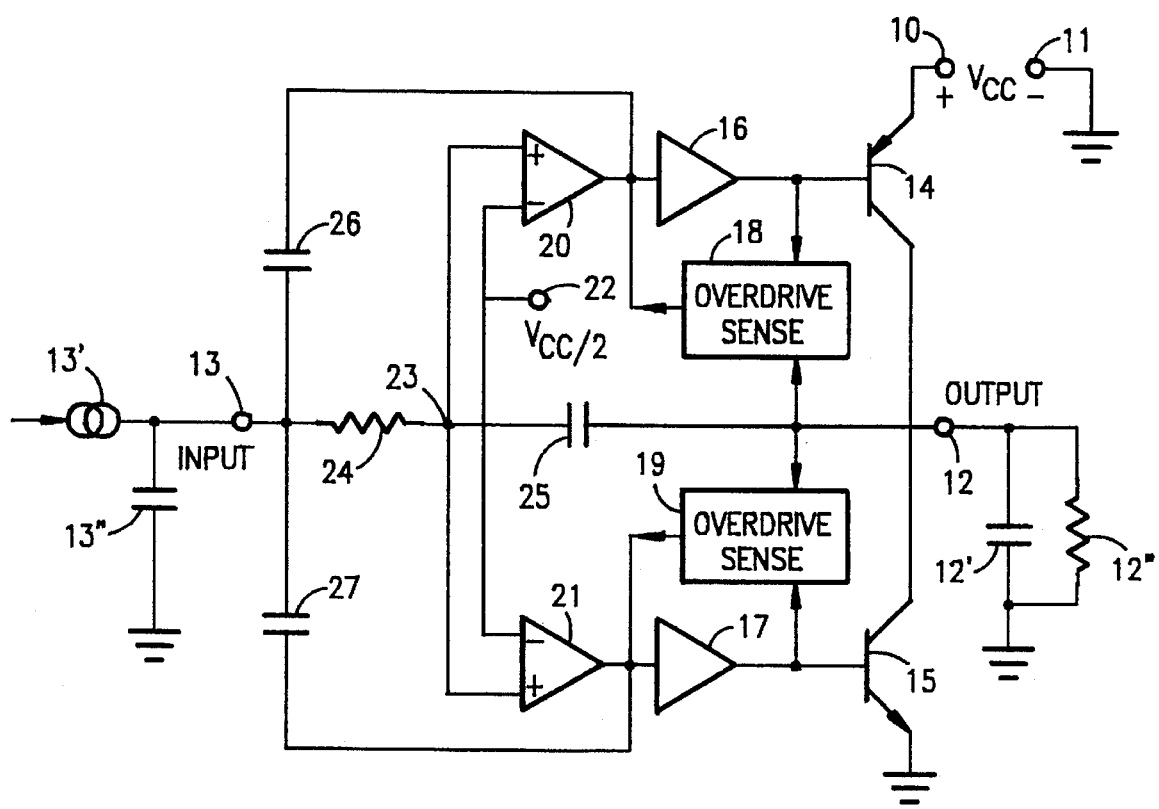
FIG. 1 is a block/schematic diagram of the circuit of the invention.

In FIG. 1, a $V_{cc}$ power supply is connected+ to terminal 10 and–to ground terminal 11. Complementary transistors 14 and 15 are connected in series across the power supply rails without any intervening components. Thus, each of transistors 14 and 15 form common emitter output transistors wherein the commonly connected collectors form stage output terminal 12. The stage input terminal is designated at 13. As shown in the drawing, terminal 13 is driven from a constant signal current source designated 13', which has a stray capacitance 13". The output stage shown acts as an inverter having substantial overall voltage gain and very large current gain. The output terminal is shown driving a capacitive load 12', in parallel with a resistive load 12".

Each of transistors 14 and 15 is base driven by like conductivity emitter follower buffer drivers 16 and 17. This produces a Darlington-like output transistor connection which does not display the large saturation voltage of a true Darlington.

An overdrive sense circuit 18 is coupled between the base and collector of transistor 14 and is operated to control the input of buffer driver 16. In operation, as transistor 14 starts to saturate the overdrive sense 18 will limit the drive to transistor 14 so that hard saturation is avoided. This is important because, in hard saturation, the transistor base becomes heavily populated with minority carriers. These carriers must be removed before transistor conduction can be reduced. In effect, the transistor base presents a large shunt-capacitance which greatly slows high frequency performance. By limiting the saturation, the benefits of large signal swings are preserved without greatly reducing high frequency performance.

Overdrive sense 19 performs a similar hard saturation avoidance in transistor 15 and is complementary with respect to overdrive sense 18.

Diff-amps 20 and 21, respectively, drive buffer drivers 16 and 17. Their inverting inputs are connected commonly to a source of bias potential at terminal 22. This bias potential is typically at $V_{cc}/2$. The noninverting inputs are commonly connected at node 23 through resistor 24 to input terminal 13. Frequency compensation capacitor 25 is coupled between output terminal 12 and node 23. Since the circuit displays voltage gain and a signal inversion between node 23 and output terminal 12, a relatively large Miller capacitance exists at node 23. The Miller capacitance is large enough to swamp out any stray shunt capacitance and the actual value of capacitor 25 is smaller than the stray capacitance so that the circuit gain bandwidth is high. Since the Miller capacitance is large and the actual value of capacitor 25 is small (less than stray C), the gain bandwidth is higher than stray C would allow. This configuration relies upon the voltage gain of the output transistors to produce the Miller effect capacitance, which dominates the frequency response. When the output transistors go into saturation, their voltage gain declines thereby reducing the Miller capacitance. This means, that while a saturated transistor displays lower frequency response in saturation, the reduced Milker capacitance allows the stray C to lower the overall gain bandwidth, thereby restoring the high frequency stability.

Diff-amps 20 and 21 are desirably configured have a large current gain. This means that feed-forward capacitors 26 and 27 can be connected respectively to bypass diff amps 20 and 21 and drive buffer drivers 16 and 17, respectively, at high frequencies. This feed-forward action further improves the high frequency performance and stability of the circuit.

Figure 2:
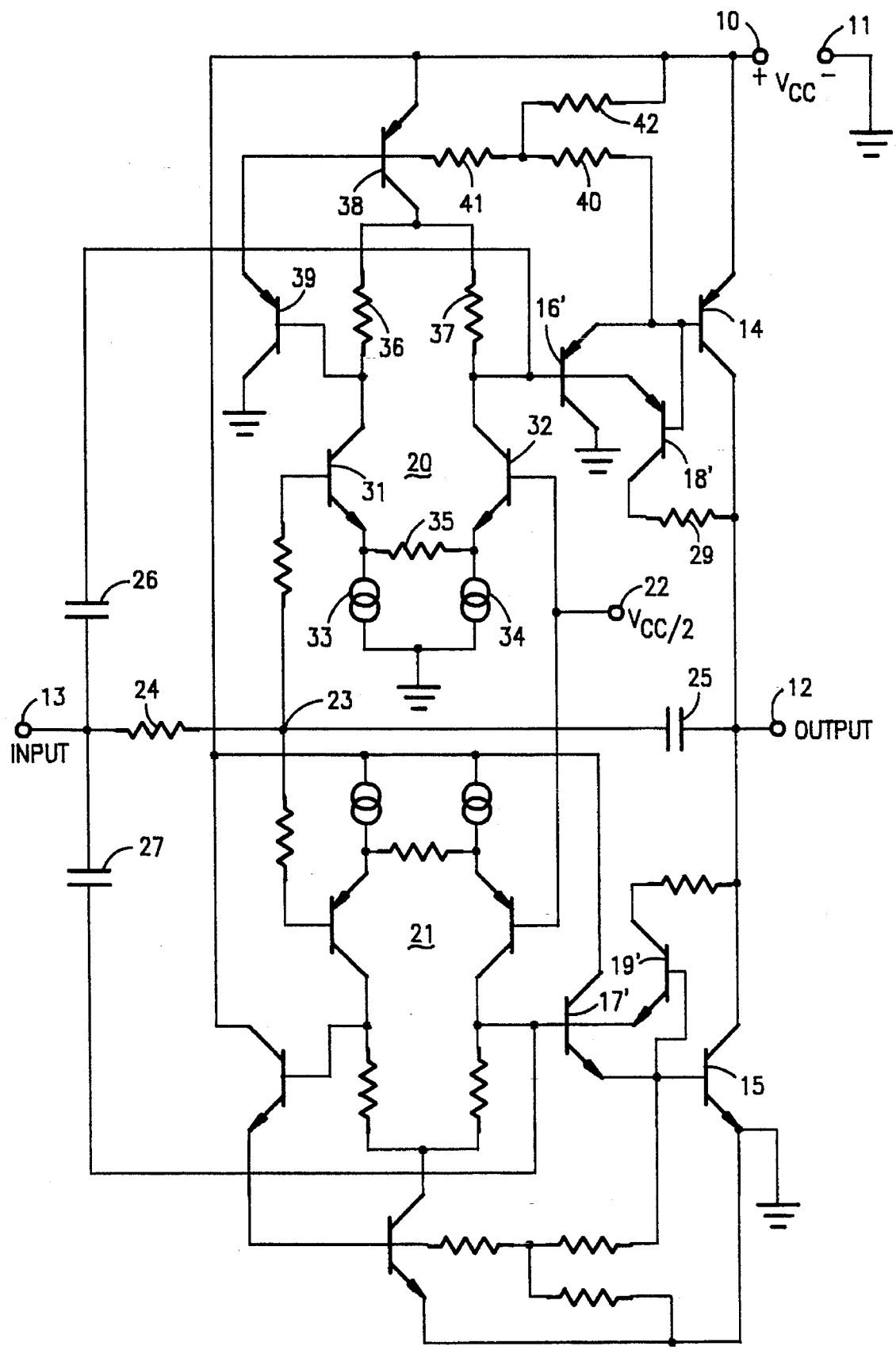
FIG. 2 is a simplified schematic diagram of the circuit of the invention.

FIG. 2 is a simplified schematic diagram of the circuit of the invention and shows the details of the blocks illustrated in FIG. 1. Where the various components are the same as those of FIG. 1, the same reference numerals are used. Transistor 18' is the overdrive sense element of FIG. 1 and it is a replica of output transistor 14, but is constructed on a smaller scale.

When transistor 14 goes into saturation its collector will be close to the $+V_{cc}$ rail and its base will be sufficiently negative, with respect to its collector, that the collector will inject minority carriers into the base. Thus, the output transistor is driven into what is known as inverted operation where the collector acts as an emitter. The minority carriers thereby injected into the base must be removed before the transistor can be turned off to complete a signal cycle. This charge removal delay can result in signal glitches or spikes that appear in the transfer function of high signal frequencies. Thus, it is highly desirable to avoid hard saturation in the output transistors because hard saturation results in vastly increased minority carrier base injection over that encountered in soft saturation.

When transistor 14 becomes inverted, as it goes into saturation, transistor 18' will also invert so that its collector functions as an emitter and its emitter, as drawn, functions as a collector. Thus, when transistor 18' conducts, in its inverted state, the base of driver transistor 16 will be pulled up so as to reduce or limit the base drive to transistor 14. Resistor 29 functions to limit the inverted current flow in transistor 18. Thus, the overdrive sense acts to limit the current flow of transistor 14 in saturation.

Transistor 19' performs the overdrive sense function in transistor 15 in the same manner that transistor 18' works with transistor 14. Resistor 30 limits the inverted current flow in transistor 19'. As a result of the actions of transistors 18' and 19', hard saturation in the output transistors is circumvented without interposing any circuit components in series with their emitter-collector paths. This permits the output terminal to provide a substantially rail-to-rail signal swing. A further benefit is that the supply currents, through transistors 16' and 17', will be limited when the output transistors saturate.

Diff-amp 20 is composed of differentially operated transistors 31 and 32. The collector of transistor 32 comprises the diff-amp output and its base therefore comprises the inverting input. Constant current sinks 33 and 34, respectively, return the emitters of transistors 31 and 32 to ground supply rail 11 and resistor 35 couples the emitters together. Resistors 36 and 37, respectively, return the collectors of transistors 31 and 32 to the positive supply rail by way of transistor 38. It can be seen that transistors 38 and 39, acting together, from a virtual ground which clamps the collector of transistor 31 at two diodes below $V_{cc}$. Likewise, the collector of transistor 32 is clamped at the same level by the actions of transistors 14 and 16'. Thus, as long as $V_{cc}$ is greater than two diodes above ground, saturation in transistors 31 and 32 will be avoided. This means that the circuit can function well at low supply voltages.

The bases of transistors 14 and 38 are returned to the $+V_{cc}$ rail by resistors 40–42. If resistors 40 and 41 are matched, it can be seen that transistors 14 and 38 will conduct at equal current densities. The current in transistor 38 will equal the sum of the currents in sinks 33 and 34. However, by simply rationing the values of resistors 40 and 41 the current in transistor 14 can be made to have any desired value. In the preferred embodiment of the invention, current sinks 33 and 34 were operated at about 20 microamperes and the resistors were rationed so that about 240 microamperes flowed in transistor 14. This is the quiescent current flow that biases transistor 14 for class AB operation.

In the overall operation of the circuit, the values of current sinks 36 and 37, along with the value of resistor 35, are selected to determine a well controlled current limit. The value of resistor 35 can be can be independently selected to optimize the transient response settling time when a capacitive load is connected to output terminal 12.

Op-amp 21, whose output drives the base of transistor 17, is a complementary mirror image of op-amp 20. Thus it functions in the same way, except for the polarity inversion, to drive and bias transistor 17 and hence output transistor 15. Accordingly, the individual components of op-amp 21 are not designated or described further.

EXAMPLE

In the preferred embodiment of the invention the following component values were employed:

| COMPONENT | VALUE |
| --- | --- |
| Capacitor 22 | 2.5 pf |
| Capacitors 23 and 24 | 7.4 pf |
| Resistor 24 | 8.24K ohms |
| Resistor 29 | 400 ohms |
| Current Sinks 33 and 34 | 20 microamperes |
| Resistor 35 | 17.8K ohms |
| Resistors 36 and 37 | 4.6K ohms |
| Resistor 39 | 113 ohms |
| Resistor 40 | 5.1K ohms |
| Resistor 41 | 11K ohms |
| Resistor 42 | 11.5K ohms |

The circuit was designed to operate with a 5-volt supply, but could operate at supply levels as low as 1.5 volts. It could also operate at substantially higher supply voltages. The quiescent class AB bias current was about 250 microamps. The output terminal would swing to within 20 millivolts of the supply rails. The circuit could source and sink a maximum current of about 12 ma at the output terminal and could drive a 500 pf load without oscillation.

The invention has been described and a preferred embodiment detailed. When a person skilled in the art reads the foregoing description, alternatives and equivalents, within the spirit and intent of the invention, will be apparent. Accordingly, it is intended that the scope of the invention be limited only by the claims that follow.

I claim:

1. A rail-to-rail operational amplifier output stage circuit having input and output terminals, positive and negative power supply rails connectable to a source of operating power and first and second complementary common-emitter output transistors coupled between said power supply rails without any intervening circuit components, whereby the collectors of said first and second output transistors comprise said output terminal, said circuit comprising:

first and second emitter follower buffer drivers respectively coupled to drive the bases of said first and second output transistors, respectively, said first emitter follower buffer driver having a structure complementary to the structure of said second emitter follower buffer driver;

a first and second differential amplifiers having outputs respectively coupled to drive said first and second buffer drivers, respectively, said first differential amplifier having a structure complementary to the structure of said second differential amplifier;

means for coupling the inverting inputs of said first and second differential amplifiers to a source of bias potential;

means for coupling the noninverting inputs of said first and second differential amplifiers together to comprise an input node; and means for coupling said input node to said circuit input terminal, wherein said means for coupling said input node to said circuit input terminal comprises a resistor and said output stage circuit further includes a compensation capacitor connected between said output terminal and said input node.

2. A rail-to-rail operational amplifier output stage circuit having input and output terminals, positive and negative power supply rails connectable to a source of operating power and first and second complementary common-emitter output transistors coupled between said power supply rails without any intervening circuit components, whereby the collectors of said first and second output transistors comprise said output terminal, said circuit comprising:

first and second emitter follower buffer drivers respectively coupled to drive the bases of said first and second output transistors, respectively, said first emitter follower buffer driver having a structure complementary to the structure of said second emitter follower buffer driver;

a first and second differential amplifiers having outputs respectively coupled to drive said first and second buffer drivers, respectively, said first differential amplifier having a structure complementary to the structure of said second differential amplifier;

means for coupling the inverting inputs of said first and second differential amplifiers to a source of bias potential;

means for coupling the noninverting inputs of said first and second differential amplifiers together to comprise an input node;

means for coupling said input node to said circuit input terminal; and overdrive sensing means coupled between the collector and base of each of said first and second output transistors with said overdrive sensing means having an output coupled to each of said first and second buffer drivers whereby, when said first or second output transistor starts to saturate, the drive thereto is reduced, thereby avoiding hard saturation.

3. The output stage circuit of claim 2 wherein said overdrive sensing means comprises a first overdrive sensing means transistor, of like conductivity to said first output transistor, coupled to said first output transistor, and a second overdrive sensing means transistor, of like conductivity to said second output transistor, coupled to said second output transistor, wherein said first and second sensing means transistors have their bases respectively coupled to the bases of the first and second output transistors, respectively, their collectors respectively coupled to the collectors of the first and second output transistors, respectively, and their emitters respectively coupled to the first and second buffer drivers, respectively.

4. The output stage circuit of claim 3 wherein said first sensing means transistor is constructed to have a fraction of the size of the first output transistor and said second sensing means transistor is constructed to have a fraction of the size of the second output transistor, wherein said sensing means further comprises:

a first current limiting resistance coupling said first sensing means transistor to said first output transistor; and a second current limiting resistance coupling said second sensing means transistor to said second output transistor.

5. A rail-to-rail operational amplifier stage circuit having input and output terminals and positive and negative supply rails connectable to a source of operating power said circuit comprising:

a first PNP transistor having its emitter connected to said positive supply rail, its collector connected to said output terminal and having a base;

a first NPN transistor having its emitter connected to said negative supply rail, its collector connected to said output terminal and having a base;

a second PNP transistor having its emitter coupled to said base of said first PNP transistor, its collector connected to said negative supply rail and having a base;

a second NPN transistor having its emitter coupled to said base of said first NPN transistor, its collector connected to said positive supply rail and having a base;

a third NPN transistor having its emitter coupled by way of a first current source to said negative supply rail, its base coupled to a source of bias potential and its collector coupled to said base of said second PNP transistor;

a fourth NPN transistor having its emitter coupled by way of a second current source to said negative supply rail, its base coupled to a common signal node and having a collector, said common signal node coupled to the input terminal;

a first resistor coupled between said emitters of said third and fourth NPN transistors;

a third PNP transistor having its base coupled to said collector of said fourth NPN transistor, its coupled to said negative supply rail and having an emitter;

a fourth PNP transistor having its emitter connected to said positive supply rail, its base connected to said emitter of said third PNP transistor and its collector coupled via second and third resistors respectively to said collectors of said third and fourth NPN transistor collectors;

fourth and fifth resistors coupled in series between said bases of said first and fourth PNP transistors;

a sixth resistor connected between said positive supply rail and the juncture of said fourth and fifth resistors;

a fifth PNP transistor having its emitter coupled to said positive supply rail via a third current source, its base coupled to said base of said third NPN transistor and its collector coupled to said base of said second NPN transistor;

a sixth PNP transistor having its emitter coupled to said positive supply rail via a fourth current source, its base coupled to said common signal node and having a collector;

a fifth NPN transistor having its emitter connected to said negative supply rail, its collector coupled by seventh and eighth resistors respectively to said collectors of said fifth and sixth PNP transistors and having a base;

a sixth NPN transistor having its emitter coupled to said base of said fifth NPN transistor, its collector coupled to said positive supply rail and its base coupled to said collector of said sixth PNP transistor;

seventh and eighth resistors coupled in series between the bases of said first and fifth NPN transistors;

a ninth resistor connected between the negative supply rail and the juncture of said seventh and eighth resistors; and a frequency compensation capacitor coupled between said output terminal and said common signal node.

6. The circuit of claim 5 further including:

a seventh PNP transistor having its emitter coupled to said base of said second PNP transistor, its collector coupled to said collector of said first PNP transistor and its base coupled to said base of said first PNP transistor; and a seventh NPN transistor having its emitter coupled to said base of said second NPN transistor, its collector coupled to said collector of said first NPN transistor and its base coupled to said base of said first NPN transistor.

7. The circuit of claim 5 further comprising:

a tenth resistor coupling said common signal node to said input terminal; and a pair of feed-forward capacitors commonly connected to said input terminal and separately connected, respectively, to said bases of said second PNP and said second NPN transistors.

8. A rail-to-rail operational amplifier output stage circuit having input and output terminals, positive and negative power supply rails connectable to source of operating power and first and second complementary common-emitter output transistors coupled between said power supply rails without any intervening circuit components, whereby the collectors of said first and second output transistors comprise said output terminal, said circuit comprising:

first and second emitter follower buffer drivers respectively coupled to drive the bases of said first and second output transistors, respectively, said first emitter follower buffer driver having a structure complementary to the structure of said second emitter follower buffer driver;

first and second differential amplifiers having outputs respectively coupled to drive said first and second buffer drivers, respectively, said first differential amplifier having a structure complementary to the structure of said second differential amplifier;

means the coupling the inverting inputs of said first and second differential amplifiers to a source of bias potential;

means for directly connecting the noninverting inputs of said first and second differential amplifiers together to comprise an input node; and means for coupling said input node to said circuit input terminal, wherein said means for coupling said input node to said circuit input terminal comprises a resistor and said output stage circuit further includes a compensation capacitor connected between said output terminal and said input node.

9. A rail-to-rail operational amplifier output stage circuit having input and output terminals, positive and negative power supply rails connectable to a source of operating power and first and second complementary common-emitter output transistors coupled between said power supply rails without any intervening circuit components, whereby the collectors of said first and second output transistors comprise said output terminal, said circuit comprising:

first and second emitter follower buffer drivers respectively coupled to drive the bases of said first and second output transistors, respectively, said first emitter follower buffer driver having a structure complementary to the structure of said second emitter follower buffer driver;

first and second differential amplifiers having outputs respectively coupled to drive said first and second buffer drivers, respectively, said first differential amplifier having a structure complementary to the structure of said second differential amplifier;

means for coupling the inverting inputs of said first and second differential amplifiers to a source of bias potential;

means for directly connecting the noninverting inputs of said first and second differential amplifiers together to comprise an input node;

means for coupling said input node to said circuit input terminal; and overdrive sensing means coupled between the collector and base of each of said first and second output transistors with said overdrive sensing means having an output coupled to each of said first and second buffer drivers whereby, when said first or second output transistor starts to saturate, the drive thereto is reduced, thereby avoiding hard saturation.

10. The output stage circuit of claim 9, wherein said overdrive sensing means comprises a first overdrive sensing means transistor, of like conductivity to said first output transistor, coupled to said first output transistor, and a second overdrive sensing means transistor, of like conductivity to said second output transistor, coupled to said second output transistor, wherein said first and second sensing means transistors have their bases respectively coupled to the bases of the first and second output transistors, respectively, their collectors respectively coupled to the collectors of the first and second output transistors, respectively, and their emitters respectively coupled to the first and second buffer drivers, respectively.

11. The output stage circuit of claim 10, wherein said first sensing means transistor is constructed to have a fraction of the size of the first output transistor and said second sensing means transistor is constructed to have a fraction of the size of the second output transistor, wherein said sensing means further comprises:

a first current limiting resistance coupling said first sensing means transistor to said first output transistor; and a second current limiting resistance coupling said second sensing means transistor to said second output transistor.

12. A rail-to-rail operational amplifier output stage circuit having input and output terminals, positive and negative power supply rails connectable to a source of operating power and first and second complementary common-emitter output transistors coupled between said power supply rails without any intervening circuit components, whereby the collectors of said first and second output transistors comprise said output terminal said circuit comprising:

first and second emitter follower buffer drivers respectively coupled to drive the bases of said first and second output transistors, respectively, said first emitter follower buffer driver having a structure complementary to the structure of said second emitter follower buffer driver; p1 first and second differential amplifiers having outputs respectively coupled to drive said first and second buffer drivers, respectively, said first differential amplifier having a structure complementary to the structure of said second differential amplifier;

means for coupling the inverting inputs of said first and second differential amplifiers to a source of bias potential;

means for directly connecting the noninverting inputs of said first and second differential amplifiers together to comprise an input node;

means for coupling said input node to said circuit input terminal, wherein said first differential amplifier includes a first load transistor coupled to the positive power supply rail and a complementary output of said first differential amplifier includes a first emitter follower that drives the base of said first load transistor and, further, wherein said second differential amplifier includes a second load transistor coupled to the negative power supply rail and a complementary output of said second differential amplifier includes a second emitter follower that drives the base of said second load transistor, and biasing resistor means for coupling the bases of said first load transistor and said first output transistor to said positive power supply rail and for coupling the bases of said second load transistor and said second output transistor to said negative power supply rail.

13. A rail-to-rail operational amplifier output stage circuit having input and output terminals, positive and negative power supply rails connectable to a source of operating power and first and second complementary common-emitter output transistors coupled between said power supply rails without any intervening circuit components, whereby the collectors of said first and second output transistors comprise said output terminal, said circuit comprising:

first and second emitter follower buffer drivers respectively coupled to drive the bases of said first and second output transistors, respectively, said first emitter follower buffer driver having a structure complementary to the structure of said second emitter follower buffer driver;

first and second differential amplifiers having outputs respectively coupled to drive said first and second buffer drivers, respectively, said first differential amplifier having a structure complementary to the structure of said second differential amplifier;

means for coupling the inverting inputs of said first and second differential amplifiers to a source of bias potential;

means for coupling the noninverting inputs of said first and second differential amplifiers together to comprise an input node such that a signal received at the input node is simultaneously provided to the noninverting input of said first differential amplifier and the noninverting input of said second differential amplifier;

a compensation capacitor connected between said output terminal and said input node; and means for coupling said input node to said circuit input terminal, comprising a resistor.

14. A rail-to-rail operational amplifier output stage circuit having input and output terminals, positive and negative power supply rails connectable to a source of operating power and first and second complementary common-emitter output transistors coupled between said power supply rails without any intervening circuit components, whereby the collectors of said first and second output transistors comprise said output terminal, said circuit comprising:

first and second emitter follower buffer drivers respectively coupled to drive the bases of said first and second output transistors, respectively, said first emitter follower buffer driver having a structure complementary to the structure of said second emitter follower buffer driver;

first and second differential amplifiers having outputs respectively coupled to drive said first and second buffer drivers, respectively, said first differential amplifier having a structure complementary to the structure of said second differential amplifier;

means for coupling the inverting inputs of said first and second differential amplifiers to a source of bias potential;

means for coupling the noninverting inputs of said first and second differential amplifiers together to comprise an input node such that a signal received at the input node is simultaneously provided to both the noninverting input of said first differential amplifier and the non-inverting input of said second differential amplifier;

means for coupling said input node to said circuit input terminal; and overdrive sensing means coupled between the collector and base of each of said first and second output transistors with said overdrive sensing means having an output coupled to each of said first and second buffer drivers whereby, when said first or second output transistor starts to saturate, the drive thereto is reduced, thereby avoiding hard saturation.

15. The output stage circuit of claim 14, wherein said overdrive sensing means comprises a first overdrive sensing means transistor, of like conductivity to said first output transistor, coupled to said first output transistor, and a second overdrive sensing means transistor, of like conductivity to said second output transistor, coupled to said second output transistor, wherein said first and second sensing means transistors have their bases respectively coupled to the bases of the first and second output transistors, respectively, their collectors respectively coupled to the collectors of the first and second output transistors, respectively, and their emitters respectively coupled to the first and second buffer drivers, respectively.

16. The output stage circuit of claim 15, wherein said first sensing means transistor is constructed to have a fraction of the size of the first output transistor and said second sensing means transistor is constructed to have a fraction of the size of the second output transistor, wherein said sensing means further comprises:

a first current limiting resistance coupling said first sensing means transistor to said first output transistor; and a second current limiting resistance coupling said second sensing means transistor to said second output transistor.

17. A rail-to-rail operational amplifier output stage circuit having input and output terminals, positive and negative power supply rails connectable to a source of operating power and first and second complementary common-emitter output transistors coupled between said power supply rails without any intervening circuit components, whereby the collectors of said first and second output transistors comprise said output terminal, said circuit comprising:

- first and second emitter follower buffer drivers respectively coupled to drive the bases of said first and second output transistors, respectively, said first emitter follower buffer driver having a structure complementary to the structure of said second emitter follower buffer driver;
- first and second differential amplifiers having outputs respectively coupled to drive said first and second buffer drivers, respectively, said first differential amplifier having a structure complementary to the structure of said second differential amplifier;
- means for coupling the inverting inputs of said first and second differential amplifiers to a source of bias potential;
- means for coupling the noninverting inputs of said first and second differential amplifiers together to comprise an input node such that a signal received at the input node is simultaneously provided to the noninverting input of said first differential amplifier and the noninverting input of said second differential amplifier;
- means for coupling said input node to said circuit input terminal,
- wherein said first differential amplifier includes a first load transistor coupled to the positive power supply rail and a complementary output of said first differential amplifier includes a first emitter follower that drives the base of said first load transistor and, further,
- wherein said second differential amplifier includes a second load transistor coupled to the negative power supply rail and a complementary output of said second differential amplifier includes a second emitter follower that drives the base of said second load transistor; and biasing resistor means for coupling the bases of said first load transistor and said first output transistor to said positive power supply rail and for coupling the bases of said second load transistor and said second output transistor to said negative power supply rail.

* * * * *